(12) United States Patent
Knerer

(10) Patent No.: US 7,815,736 B2
(45) Date of Patent: Oct. 19, 2010

(54) SUPPORTING APPARATUS FOR SUPPORTING A GROWING SINGLE CRYSTAL OF SEMICONDUCTOR MATERIAL, AND PROCESS FOR PRODUCING A SINGLE CRYSTAL

(75) Inventor: Dieter Knerer, Burghausen (DE)

(73) Assignee: Siltronic AG, Munich (DE)

( * ) Notice: Subject to any disclaimer, the term of this patent is extended or adjusted under 35 U.S.C. 154(b) by 1087 days.

(21) Appl. No.: 11/509,408

(22) Filed: Aug. 24, 2006

(65) Prior Publication Data
US 2007/0044711 A1    Mar. 1, 2007

(30) Foreign Application Priority Data
Aug. 25, 2005   (DE)   ............ 10 2005 040 229

(51) Int. Cl.
*C30B 35/00*   (2006.01)
*C30B 15/00*   (2006.01)

(52) U.S. Cl. ............... 117/208; 117/11; 117/13; 117/200; 117/206; 117/902; 117/911

(58) Field of Classification Search ............ 117/200, 117/206, 208, 902, 911, 11, 13
See application file for complete search history.

(56) References Cited

U.S. PATENT DOCUMENTS 3,857,679 A  * 12/1974  Allred ................... 117/204
5,879,448 A    3/1999  Urano et al.
6,015,461 A  *  1/2000  Izumi .................... 117/218
6,077,347 A    6/2000  Ohtsukasa et al.

FOREIGN PATENT DOCUMENTS

| EP | 0867534    | 9/1998  |
|----|------------|---------|
| EP | 0869202    | 10/1998 |
| JP | 10-273387  | 10/1998 |

* cited by examiner

*Primary Examiner*—Robert M Kunemund
*Assistant Examiner*—Matthew J Song
(74) *Attorney, Agent, or Firm*—Brooks Kushman P.C.

(57) ABSTRACT

An apparatus for supporting a single crystal during Czochralski crystal pulling below a thickened crystal neck has lower bearing surface(s) with a central opening inscribable with a horizontal circle of diameter $D_1$, centered on a vertical axis, the bearing surface(s) connected by connecting element(s) to minimally one securing element for securing to a crystal pulling lifting device, the connecting elements arranged to provide a clear-space in the region above the bearing surface (s) in which a circle of diameter $D_2$ centered on the vertical axis ($D_2 > D_1$) is inscribable over a length of the vertical axis. The unitary apparatus is useful for crystal ingot growth by immersion into the semiconductor melt prior to growth of a Dash neck and a thickening of the Dash neck. The apparatus is then raised to support the crystal by bearing against the bottom of the thickening.

15 Claims, 6 Drawing Sheets

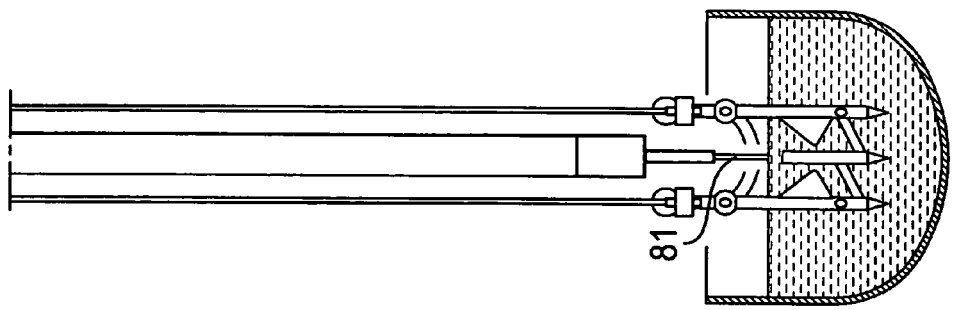
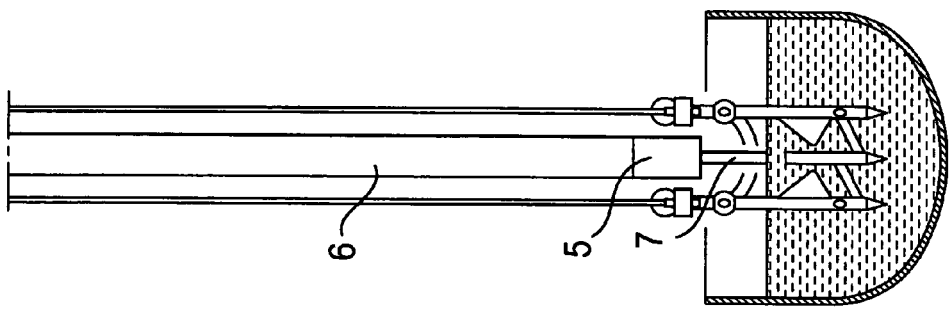
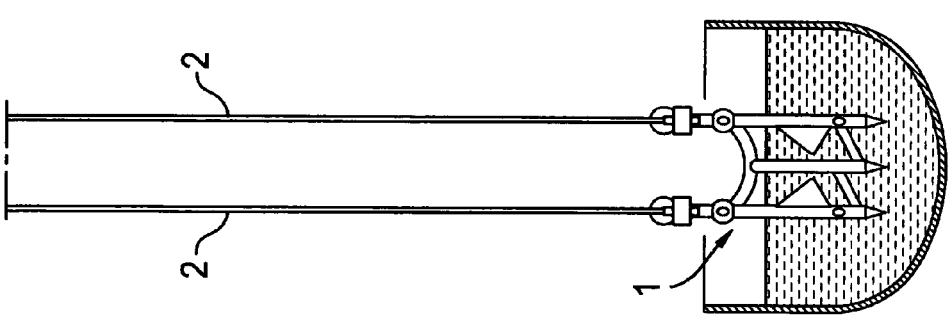
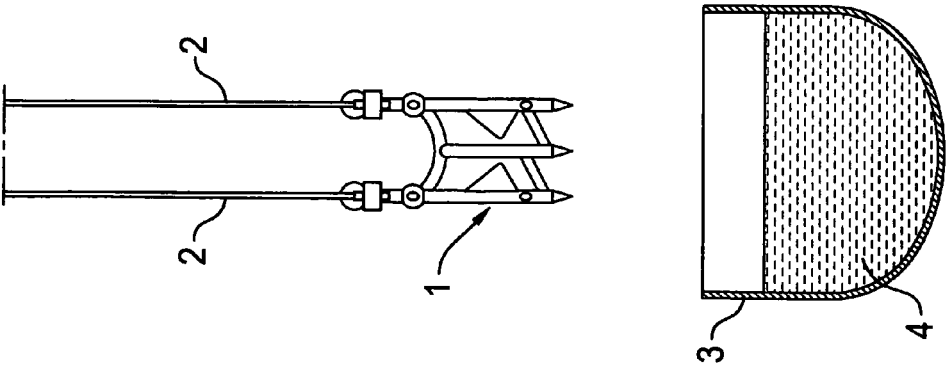

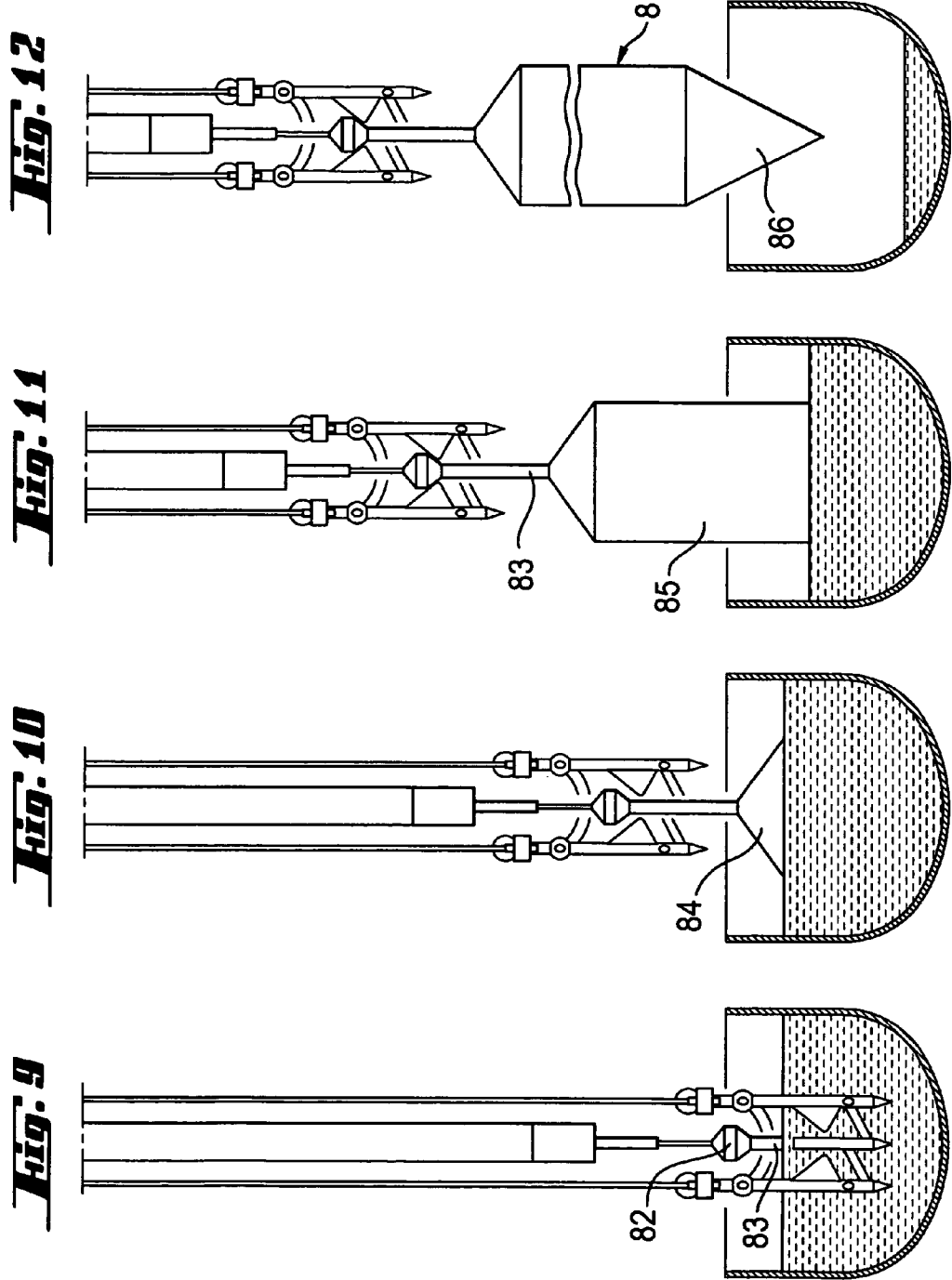

SUPPORTING APPARATUS FOR SUPPORTING A GROWING SINGLE CRYSTAL OF SEMICONDUCTOR MATERIAL, AND PROCESS FOR PRODUCING A SINGLE CRYSTAL

BACKGROUND OF THE INVENTION

1. Field of the Invention

The invention relates to a supporting apparatus for supporting a thickening at the Dash neck of a single crystal consisting of semiconductor material in a crystal pulling installation which operates using the Czochralski crucible pulling process, and to a process for producing a single crystal using the supporting apparatus.

2. Background Art

During the Czochralski crystal pulling process, first of all a neck of greatly reduced cross section is grown in order to suppress further growth of crystal defects which are already present in the seed crystal or originate from the seed crystal coming into contact with the melt, such as dislocations in the cylindrical part of the single crystal. The narrowed neck is referred to as the Dash neck.

Following formation of the Dash neck, the parameters of the pulling process are set in such a way that a conical portion is produced, followed by a cylindrical portion with a much larger, and virtually constant diameter. The pulling process is in turn concluded by growth of another conical portion. Usually, only the cylindrical portion is of interest as a product, for example for use in the electronics industry. For economic reasons, the diameter of single crystals, has in the past, been increased in a stepwise fashion. By way of example, silicon single crystals with a diameter of 300 mm are now currently produced on a large industrial scale. At the same time, attempts have been made to produce single crystals with the longest possible cylindrical portion. Overall, this has led to continuously increasing single crystal masses.

The increased crystal size and length have led to the problem that the Dash neck is no longer able to bear the tensile forces associated with the increased mass. The Dash neck is not generally able to reliably support silicon single crystals with a mass of more than about 250 to 300 kg. Consequently, methods and apparatuses have been developed for providing heavy single crystals with additional support during their production. In most processes of this type, the Dash neck is widened at a specific axial position, in such a way as to form a thickening. A supporting apparatus which absorbs some of the tensile force can be positioned at this thickening. Nowadays, a large number of different supporting apparatuses which operate according to this principle are known, cf. for example U.S. Pat. No. 5,879,448 and U.S. Pat. No. 6,077,347. U.S. Pat. No. 5,879,448 describes supporting apparatuses which can move vertically within the crystal pulling installation and can reduce their internal diameter in the manner of tongs. For example, they can grip the crystal after a thickening has been pulled at the crystal. An alternative option consists in a supporting apparatus with a U-shaped bearing surface being pivoted under the thickening after it has been pulled, as disclosed in U.S. Pat. No. 6,077,347.

It has been found, however, that all the known supporting apparatuses generate particles (for example through abrasion), which can lead to the single crystal being contaminated with metals. This is unacceptable given the high purity requirements of the electronics industry. Moreover, particles of metal or silicon oxides ($SiO_x$) can lead to the formation of dislocations during crystal pulling. Condensing silicon monoxide (SiO) can cause jamming in bearings and joints of the supporting apparatus.

SUMMARY OF THE INVENTION

Therefore, an object of the invention was to reliably avoid generation of particles by the supporting apparatus. This and other objects are achieved by a supporting apparatus 1 for supporting a thickening 82 at the Dash neck 81 of a single crystal 8 consisting of semiconductor material in a crystal pulling installation which operates using the Czochralski crucible pulling process, the supporting apparatus 1 in its lower region having a bearing apparatus 121, 122 with a central opening, it being possible for a circle with a diameter $D_1$, the center point of which lies on a vertical axis 16, to be inscribed in this central opening in a horizontal plane, and the bearing portion or apparatus 121, 122 being connected, by means of one or more connecting elements 132, 133, 134, to at least one securing element 14 which is arranged above the bearing apparatus 121, 122 and is suitable for being secured to a lifting device 2 of the crystal pulling installation, the connecting elements 132, 133, 134 being arranged in such a way that in the region immediately above the bearing apparatus 121, 122 they leave clear a space in which a circle with a center point lying on the axis 16, and having a diameter $D_2$ which is larger than the diameter $D_1$, can be inscribed in any desired horizontal plane, wherein the supporting apparatus 1 is inherently immobile, e.g. is of an integral construction such that the various elements of its construction cannot move with respect to other elements, for example in the manner of a bearing, hinge, etc.

BRIEF DESCRIPTION OF THE DRAWINGS

FIGS. 5 to 12 diagrammatically depict the sequence of a crystal pulling process using a supporting apparatus according to the invention.

DETAILED DESCRIPTION OF THE PREFERRED EMBODIMENT(S)

Figure 1:
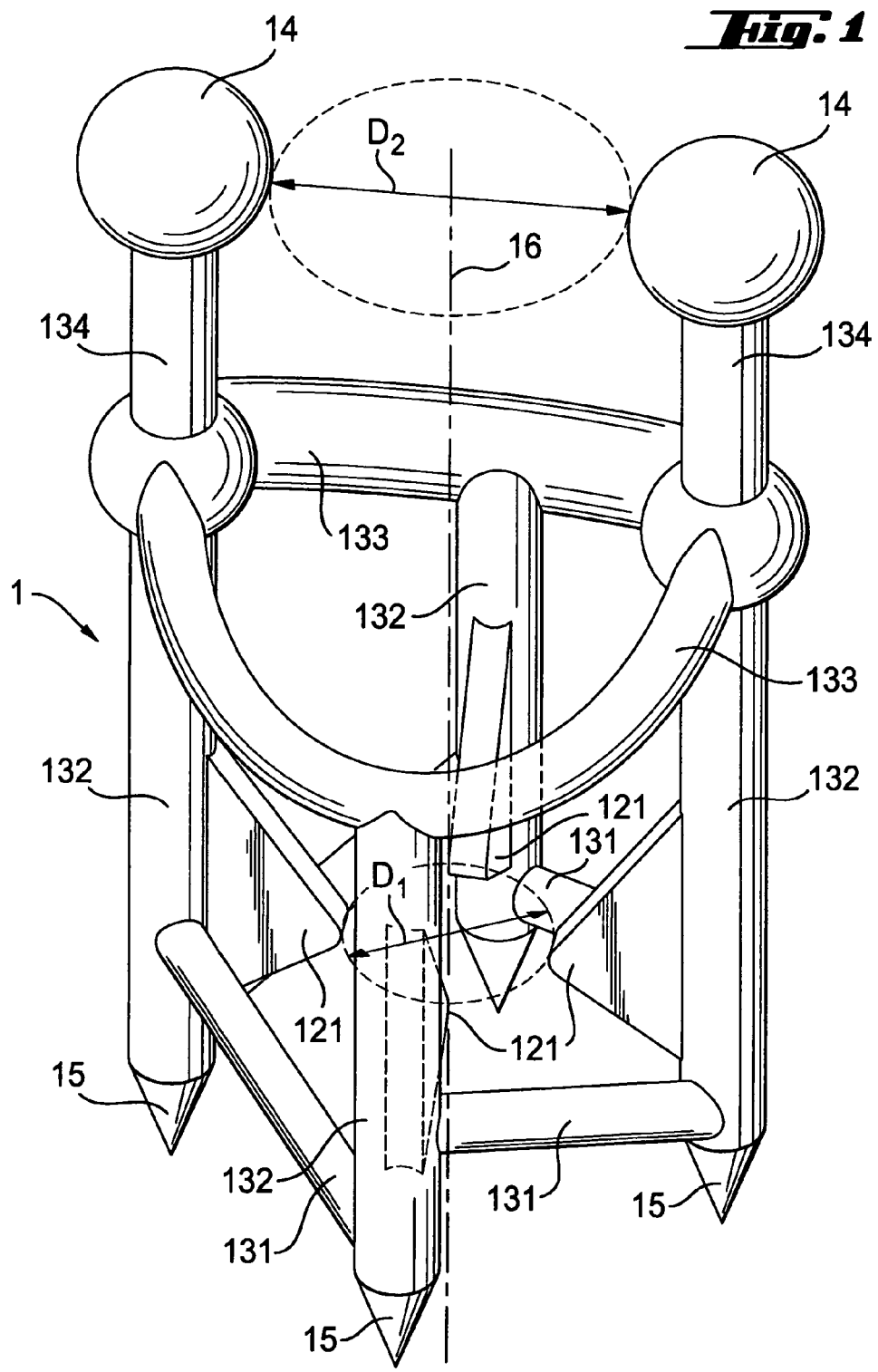
FIGS. 1 and 2 show two embodiments of a supporting apparatus according to the invention.
Figure 4:
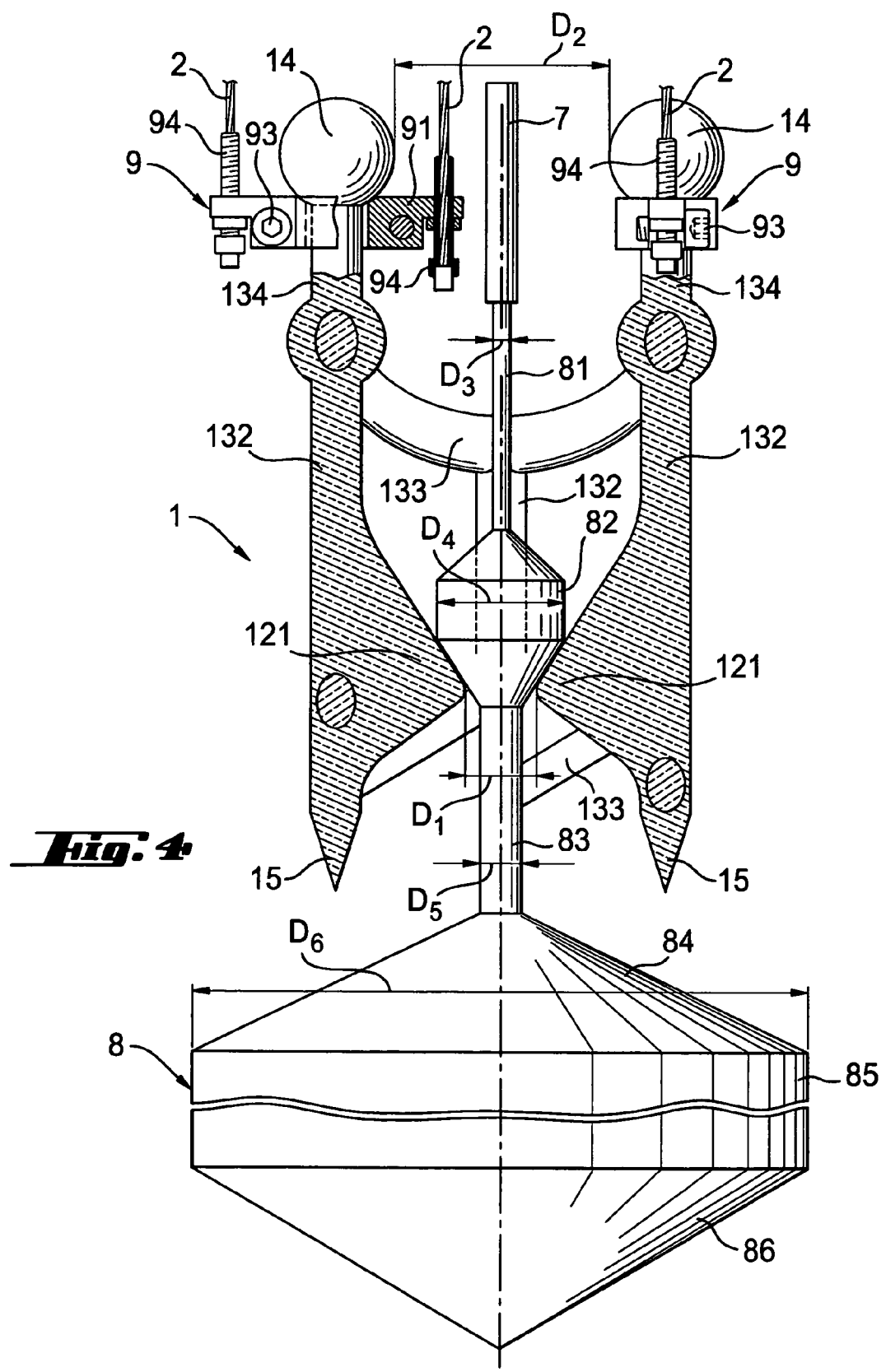
FIG. 4 shows the schematic structure of a single crystal and a cutaway the supporting apparatus with assembly apparatuses in the form of a longitudinal section. For the sake of clarity, the assembly apparatus has been illustrated rotated through 90° on the left-hand side.

The supporting apparatus 1 (FIGS. 1, 2 and 4) according to the invention, has a bearing apparatus with a central opening in its lower region. The bearing apparatus may, for example, be in the form of a continuous circular ring 122 (FIG. 2) with an internal diameter $D_1$. In this case, the upper inner side of the ring 122 supports the lower part of the thickening 82. However, the bearing apparatus may also, as illustrated in FIG. 1, have at least two, but preferably more, bearing elements 121, which are arranged symmetrically and at the same height and protrude inward in the direction of the central opening, in which case the individual bearing elements 121 are arranged on connecting elements 132. The bearing elements 121 are arranged in such a way that a circle with a diameter $D_1$, the center point of which lies on the axis 16 of the supporting apparatus 1, can be inscribed in the central opening in a horizontal plane (i.e. a plane perpendicular to the axis 16). During crystal pulling, the axis 16 preferably coincides with the axis of the Dash neck 81. The bearing elements 121 can in this way suitably support the thickening 82 from below, as illustrated by way of example in FIG. 4.

The entire bearing apparatus 121, 122 is connected to at least one securing element 14 arranged above the bearing apparatus 121, 122 by means of one or more connecting elements 132, 133, 134. The connecting elements 132, 133, 134 are preferably of rod-like design. The connecting elements 132, 133, 134 are arranged in such a way that in the region directly above the bearing apparatus 121, 122, the connecting elements leave clear a space in which a circle with a center point lying on the axis 16 and a diameter $D_2$ which is larger than the diameter $D_1$, can be inscribed in any desired horizontal plane (i.e. perpendicular to the axis 16). This means that the thickening 82 can find space in the free space between the connecting elements 132, 133, 134 without the connecting elements 132, 133, 134 touching the thickening 82.

To stabilize the supporting apparatus 1 and to prevent it from breaking apart under the load of the single crystal, the bearing elements 121 and/or the connecting elements 132, 133, 134 are preferably connected to one another by further connecting elements, for example by struts 131.

Figure 2:
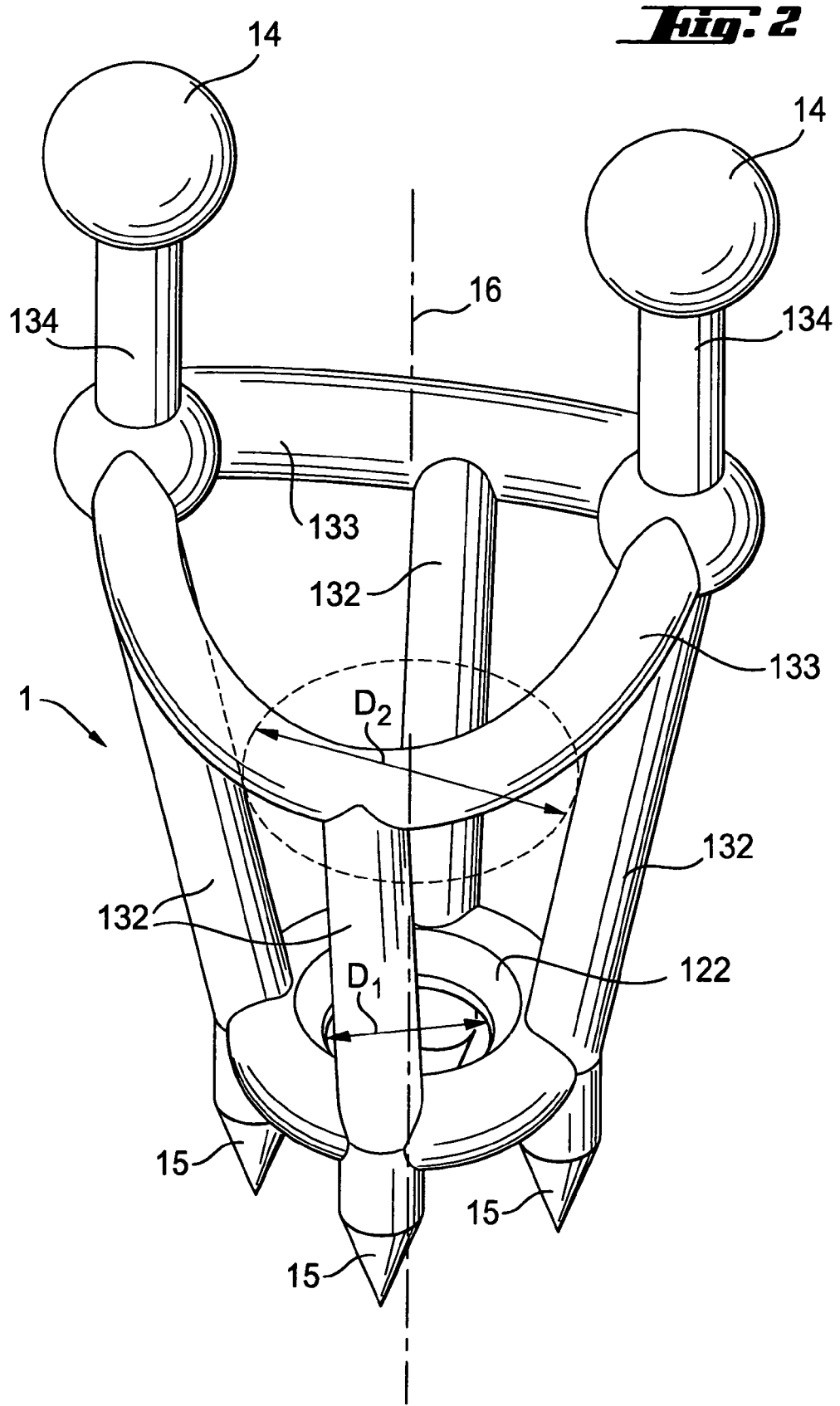

It is preferable for the bearing apparatus 121, 122 and the connecting elements 131, 132, 133, 134 together to form a type of cage structure, as illustrated in FIG. 1 or 2. The cage structure preferably has no vertical openings continuing from the lower end of the bearing apparatus 121, 122 to the upper end of the at least one securing element 14. During the crystal growing process, a supporting apparatus 1 of this kind cannot be moved laterally toward the thickening 82, for example pivoted, to support the thickening 82 with the bearing apparatus 121, 122 due to the lack of continuous vertical openings. When the crystal growing process begins, the supporting apparatus 1 has to be rather immersed in the melt 4, so that the bearing apparatus 121, 122 is located below the surface of the melt 4. During the crystal pulling process, the cage structure surrounds the Dash neck 81 and the thickening 82 without touching the Dash neck 81. Only the thickening 82 is supported by the bearing apparatus 121, 122 on its underside starting from a predetermined time in the crystal pulling process, after the supporting apparatus 1 has been vertically lifted.

Figure 3:
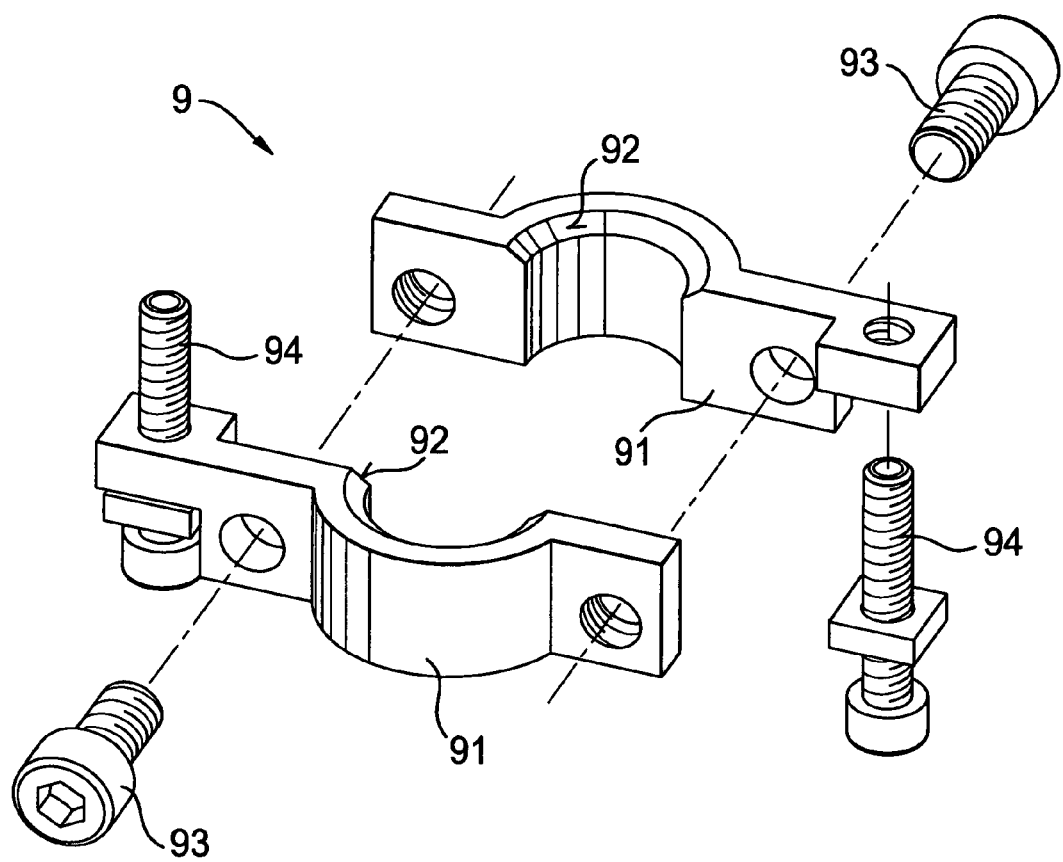
FIG. 3 shows an assembly apparatus which can be used to connect the supporting apparatus to a lifting device of the crystal pulling installation.

The at least one securing element 14 is shaped in such a way that it is suitable for being secured to a lifting device 2 of the crystal pulling installation. The lifting device 2 is used for the vertical displacement, i.e. raising and lowering, of the supporting apparatus 1 and comprises, for example, one or preferably more cables. By way of example, a two-part assembly apparatus 9, which is illustrated in FIG. 3, can be used to secure the supporting apparatus 1 to the lifting device 2. In each case two of these halves 91 surround the vertically arranged cylindrical connecting elements 134 in such a way that the spherical securing element 14 rests on the conical contact region 92 of the assembly apparatus 9 (cf. also FIG. 4). The two halves 91 are connected to one another by bolts 93. Bolt 94 has a hollow bore through which a cable of the lifting device 2 is guided. Bolt 23 permits vertical adjustment of the assembly apparatus if the cables of the lifting device 2 are of different lengths. The assembly apparatus 9 and the cables of the lifting device 2 preferably consist of molybdenum. However, it is equally preferable for the cables to be made from tungsten.

The entire supporting apparatus 1 is inherently immobile. It does not have any parts which move with respect to one another. The term "supporting apparatus" within the meaning of the invention does not encompass the assembly apparatus 9 and the lifting device 2, but only the single-piece, preferably cage-like supporting body, which is preferably made from quartz glass, as illustrated by way of example in FIG. 1 or 2.

Since the supporting apparatus 1 is immersed in the melt 4 of the semiconductor material during the starting phase of the crystal pulling process (FIG. 6 to FIG. 9), the supporting apparatus 1 preferably consists of a material which is able to withstand the melt 4 and the high temperature prevailing therein.

In the case of a silicon single crystal being produced, the supporting apparatus 1 is preferably made from quartz glass. When using quartz glass, it should be noted that crystallization and corrosion phenomena permit only a limited number of uses, and consequently the supporting apparatus 1 has to be replaced after a certain number of uses.

In order for the growth process of the single crystal 8 not to be disrupted by drops of the melt which adhere to the supporting apparatus 1 when it is lifted out of the melt and which subsequently drop back into the melt, the supporting apparatus 1 is preferably shaped in such a way that it is impossible for any hanging drops of the melt to form on the surface of all of the regions which are in contact with the melt. It is preferable for the shape of the entire supporting apparatus 1 to be such that it makes it easier for the melt to run off the surface.

This can be achieved by virtue of the fact that the surface of the supporting apparatus 1 does not have any horizontal faces, i.e. does not have any faces which lie in a plane perpendicular to the axis 16. By way of example, the struts 131 illustrated in FIG. 1 are not arranged horizontally, but rather obliquely. The oblique arrangement makes it easier for the melt to run off and prevents the formation of drops which adhere to the struts 131. For the same reason, the connecting elements 133 are not arranged horizontally, but rather obliquely. At their lowest points, the connecting elements 133 meet vertically or obliquely running connecting elements 132, at which the melt can run off further in the downward direction. The bearing elements 121 also do not have any horizontal faces and are shaped in such a way as to make it easier for the melt to run off.

Moreover, it is preferable for the supporting apparatus to have at least one run-off apparatus 15, which ensures that the melt 4 runs off when the supporting apparatus 1 is lifted out of the melt 4. It is preferable for each vertical or oblique connecting element 132, at the lower end, to carry a run-off apparatus 15, which is preferably formed as a conical extension of the connecting element 132. This also makes it possible to prevent residues of the melt solidifying on the supporting apparatus 1 at the last locations of the supporting apparatus 1 which are in contact with the melt 4. Solidified residues of the melt could flake off as the process continues and in this way disrupt the crystallization process.

The production of a supporting apparatus according to the invention can be achieved by techniques within the skill of a glass blower, and is therefore not described.

The invention also relates to a process for producing a single crystal 8 consisting of semiconductor material, with the aid of the Czochralski crystal pulling process, comprising the following steps:

a) partially immersing a supporting apparatus 1 according to the invention in a melt 4 of the semiconductor material, so that the bearing apparatus 121, 122 is located below the surface of the melt 4, b) pulling a Dash neck 81 with a diameter $D_3$ by pulling a seed crystal 7 out of the melt 4, the supporting apparatus 1 surrounding the Dash neck 81 without touching it, c) pulling a thickening 82 with a maximum diameter $D_4$ where $D_1<D_4<D_2$ and a narrowed region 83 beneath it with a minimum diameter $D_5$ where $D_3<D_5<D_1$, the supporting apparatus 1 surrounding the thickening 82 without touching it, d) lifting the supporting apparatus 1 out of the melt 4, so that the supporting apparatus 1 is no longer touching the melt 4, e) pulling a single crystal piece 84 with a continuously increasing diameter, f) pulling a cylindrical single crystal piece 85 with a diameter $D_6$ where $D_6>D_5$, and g) raising the supporting apparatus 1, so that the bearing apparatus 121, 122 touches and supports the thickening 82 from below.

The process according to the invention is diagrammatically depicted in FIGS. 5 to 12. The single crystal 8 with its various regions and diameters and the way in which they refer back to the supporting apparatus according to the invention is illustrated on a larger scale in FIG. 4.

Before the actual crystal pulling process begins, the generally polycrystalline semiconductor material located in the crucible 3 is melted in accordance with the prior art. FIG. 5 shows the state of the crystal pulling installation after the melting of the semiconductor material. The supporting apparatus 1, which is secured to a lifting device 2 within the crystal pulling installation, is in a waiting position above the crucible 3.

In step a) of the process, the supporting apparatus 1 is partially immersed in the melt 4 of the semiconductor material, so that the supporting apparatus 121, 122 is located below the surface of the melt 4 (FIG. 6). It is for this reason advantageous for the supporting apparatus 1 to be made from a material which is substantially able to withstand the melt 4 under the prevailing temperature conditions. If the melt 4 is silicon, for example, quartz glass is a suitable material for the supporting apparatus 1. It is conceivable for the supporting apparatus 1 not to be rotated about its vertical axis 16 during immersion, but the preferred option is to synchronize the rotation about the vertical axis 16 with the rotation of the crucible. However, it is particularly preferable for the rotation of the supporting apparatus 1 prior to immersion in the melt to be synchronized with the rotation of the melt 4.

In step b), as in the prior art, a seed crystal 7 attached to a seed crystal holder 5 is immersed in the melt 4 (FIG. 7) and lifted out again at a defined rate. (The seed crystal holder 5 is secured to an advancing device 6. The advancing device 6 is used to hold and vertically displace, i.e. raise and lower, the seed crystal holder 5. The advancing device 6 is, for example, a shaft or comprises one or more cables.) The pulling rate, i.e. the rate at which the advancing device 6 moves the seed crystal 7 vertically upward, is set in such a way that a region of reduced diameter $D_3$, the Dash neck 81, is formed adjoining the seed crystal 7 (FIG. 8). The relationships between pulling rate, other parameters of the pulling process and the diameter of the growing single crystal 8 are known to a person skilled in the art and therefore require no further explanation at this point. The Dash neck grows at the surface of the melt 4 within the immersed supporting apparatus 1 without touching the supporting apparatus 1. It is preferable for the seed crystal 7 and the supporting apparatus 1 to be oriented in such a way that the axis of the seed crystal coincides with the axis 16 of the supporting apparatus 1. The same applies to the remainder of the sequence of the process according to the invention.

It is preferable for step b) only to be commenced once step a) has concluded. Accordingly, it is preferable for the supporting apparatus to be immersed in the melt 4 first of all, and for the seed crystal 7 only to be brought to the melt 4 or immersed in it after this has taken place.

In step c), a thickening 82 with a maximum diameter $D_4$ is pulled. This is generally done by reducing the pulling rate, so that the diameter of the growing single crystal 8 increases to a maximum value $D_4$, with a subsequent increase in the pulling rate, so that the diameter decreases again. It is in this way possible to produce a thickening. The maximum diameter $D_4$ of the thickening 82 satisfies the condition $D_1<D_4<D_2$. The maximum diameter $D_4$ of the thickening 82 is therefore larger than the diameter $D_1$ of the central opening of the supporting apparatus 1 in the region of the bearing apparatus 121, 122 but at the same time smaller than the diameter $D_2$ of the central opening of the supporting apparatus 1 in the region above the bearing apparatus 121, 122. This means that the thickening 82 can grow and find space inside the supporting apparatus 1 without touching the supporting apparatus 1.

After the thickening 82 has been produced, a narrowed region 83 is pulled. At its thinnest point, this narrowed region 83 has a diameter $D_5$ which satisfies the condition $D_3<D_5<D_1$. The diameter $D_5$ of the narrowed region 83 must be larger than the diameter $D_3$ of the Dash neck 81, since the additional support for the growing single crystal 8 will be provided at the thickening 82. Therefore, the narrowed region 83 must be sufficiently thick for it to be able to reliably carry the entire mass of the single crystal 8. The diameter $D_5$ of the narrowed region 83, however, must on the other hand be smaller than the diameter $D_1$ of the central opening of the supporting apparatus 1 in the region of the bearing apparatus 121, 122, so that the narrowed region 83 can grow and find space within this opening without touching the apparatus. FIG. 9 shows the situation after the thickening 82 has been pulled and during the pulling of the narrowed region 83. The lower part of the supporting apparatus 1 is still immersed in the melt 4. In step d), the supporting apparatus 1 is lifted by the lifting device 2 by a distance which is such that it no longer touches the melt 4 (FIG. 10). The formation of hanging drops of the melt on the supporting apparatus 1 while it is being lifted out of the melt 4 can be avoided by the design of the supporting apparatus 1 described above. Drops which fall back into the melt 4 could disrupt the crystallization process and lead to crystal defects. The fact that the diameters $D_1$, $D_2$, $D_4$ and $D_5$ are matched to one another as described above ensures that the supporting apparatus 1 does not laterally touch the growing single crystal 8 in any region. It is preferable for the supporting apparatus 1 in step d) to be lifted only by a distance which is such that the bearing apparatus 121, 122 still does not touch the thickening 82 from below (FIG. 10), since the supporting apparatus is still in a region where the temperature is very high and is therefore not yet mechanically stable. It is preferable for step d) to take place during step c), most preferably in the final phase of step c), i.e. during the pulling of the narrowed region 83.

In step e), a single crystal piece 84 with a continuously increasing diameter is pulled, preferably by reducing the pulling rate (FIG. 10), until the desired diameter D6 has been reached. The single crystal piece 84 may, for example, adopt a conical shape. It is therefore also referred to as a starting cone. During this step, the supporting apparatus 1 is preferably lifted continuously, so that the supporting apparatus 1 still does not touch the thickening 82. By way of example, the rate at which the supporting apparatus 1 is lifted may be identical to the pulling rate.

Finally, in step f), a cylindrical single crystal piece 85 with a constant diameter D6 is pulled. During the first phase of this step, the supporting apparatus 1 preferably continues to be lifted, so that the supporting apparatus 1 still does not touch the thickening 82, until the supporting apparatus 1 has sufficiently cooled and is sufficiently mechanically stable to be able to carry part of the weight of the single crystal 8.

In step g), finally, the supporting apparatus 1 is lifted to such an extent that the bearing apparatus 121, 122 touches the thickening 82 from below and absorbs part of the weight of the growing single crystal 8 (FIG. 11). It is preferable for the lifting to be initiated at a predetermined time or at a predetermined length of the cylindrical single crystal piece 85 or at a predetermined weight of the single crystal 8. The lifting is preferably terminated automatically when the weight acting on the supporting apparatus reaches a predetermined value.

Step g) can in principle take place at any desired time after production of the thickening 82 in step c), i.e. during steps d), e) or f). However, it is preferable for step g) only to be initiated once the supporting apparatus 1 has cooled sufficiently for it to be able to support load. When step g) is initiated, the supporting apparatus should already have elastic properties but should still react by deformation under punctiform load. A minor deformation under punctiform load ensures that an optimum, uniform support is provided to the thickening 82 by the bearing device 121, 122. The precise time at which step g) is carried out is therefore preferably adapted to the materials properties of the supporting apparatus 1. However, step g) will generally be carried out during step f), i.e. during the pulling of the cylindrical single crystal piece 85. It is preferable for the rotation of the supporting apparatus 1 about its vertical axis 16 to be synchronized with the rotation of the single crystal about its longitudinal axis before the supporting apparatus touches the thickened portion 82 from below.

As step f) continues, and as the length of the cylindrical single crystal piece 85 grows, the supporting apparatus 1 is preferably lifted at a rate which is identical to the pulling rate. As a result of the further lifting, the supporting apparatus moves continuously further away from the hot melt 4 and is increasingly cooled. Therefore, the supporting apparatus can be subjected to increasingly high loads during step f).

The crystal pulling process is concluded in the same way as in the prior art by pulling a single crystal piece 86 with a decrease in diameter. This single crystal piece is generally referred to as the end cone. FIG. 12 illustrates the situation in the crystal pulling installation after the crystal pulling process has ended. To remove the single crystal 8 from the crystal pulling installation, it is preferably supported from below and from the side with the aid of a suitable apparatus, and the narrowed region 83 of the single crystal is severed. After the lower part of the single crystal 8 with the regions 84, 85 and 86 has been removed, the seed crystal 7 together with the upper regions 81 and 82 of the single crystal can be taken away.

The fact that the invention functions without parts within the supporting apparatus that are mounted such that they can move relative to one another, makes it possible to suppress the formation of abrasion and therefore the production of disruptive particles. Moreover, deposits, for example of silicon monoxide dust, cannot jam bearings or rotary connections.

Supporting apparatuses according to the prior art are exposed to the atmosphere in the pulling installation throughout the entire crystal pulling process (i.e. including during the melting of the semiconductor material located in the crucible, the stabilization, the initial movement of the seed crystal and the production of the first regions of the single crystal). Therefore, silicon oxides are deposited on the supporting apparatuses. Pieces of these deposited silicon oxides can fall off as soon as the supporting apparatus is moved. By contrast, in the process according to the invention, during the starting phase of the crystal pulling process large parts of the surface of the supporting apparatus are located below the surface of the melt and are not therefore in contact with the atmosphere. Therefore, it is scarcely possible for silicon oxides to be deposited on the surface of the supporting apparatus. Silicon oxides which have been deposited prior to immersion in the melt are dissolved again during the immersion.

This, together with the avoidance of moving parts, leads to a considerable reduction in the frequency with which particles occur compared to the prior art, which has only disclosed supporting apparatuses with moving parts.

Despite the absence of moving parts, the invention allows the growing single crystal to be reliably supported at a thickening in the neck region.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A supporting apparatus for supporting a thickening at the Dash neck of a single crystal comprising semiconductor material in a crystal pulling installation which operates using the Czochralski crucible pulling process, comprising a supporting apparatus having in a lower region a bearing portion with a central opening inscribable with a horizontal a circle of diameter $D_1$, the center point of which lies on a vertical axis in this central opening, the bearing portion connected by one or more connecting elements to at least one securing element positioned above the bearing portion securable to a lifting device of the crystal pulling installation, the connecting elements arranged such that in the region immediately above the bearing portion they leave clear a space in which a circle of a diameter $D_2$ with a center point lying on the vertical axis can be inscribed in a horizontal plane over a length of the vertical axis, where $D_2$ is greater than $D_1$, the supporting apparatus being inherently immobile, and wherein the supporting apparatus has a cage structure made of quartz glass.

2. The supporting apparatus of claim 1, which comprises a continuous circular ring with internal diameter $D_2$, and at least two bearing elements arranged symmetrically relative to the vertical axis and attached to the continuous circular ring, the bearing elements connected to each other by struts.

3. The supporting apparatus of claim 1, further comprising a lifting apparatus which lifts the supporting apparatus to contact the thickening, said lifting apparatus independently adjustable relative to lifting of the seed crystal from the melt.

4. The supporting apparatus of claim 1, shaped such that hanging drops of a melt of the semiconductor material do not form at its surface.

5. The supporting apparatus of claim 1, wherein its surface has no horizontal faces.

6. The supporting apparatus of claim 1, which comprises at least one run-off portion which ensures that the melt runs off in a non-dripping fashion when the supporting apparatus is lifted out of the melt.

7. The supporting apparatus of claim 1, which is configured such that no contact of the supporting apparatus with the dash neck or thickening occurs until the thickening and support apparatus have been raised above a melt surface of semiconductor material in the Czochralski crucible.

8. A process for producing a single crystal comprising semiconductor material in a Czochralski crystal pulling process, comprising the following steps:

a) partially immersing a supporting apparatus of claim 1 in a melt of semiconductor material, so that the bearing portion is located below the surface of the melt, b) pulling a Dash neck with a diameter $D_3$ by pulling a seed crystal out of the melt, the supporting apparatus surrounding the Dash neck without touching it, c) pulling thickened neck with a maximum diameter $D_4$ where $D_1 < D_4 < D_2$ and then pulling a narrowed neck beneath the thickened neck with a minimum diameter $D_5$ where $D_3 < D_5 < D_1$, the supporting apparatus surrounding the thickened neck without touching it, d) lifting the supporting apparatus out of the melt, so that the supporting apparatus is no longer touching the melt, e) pulling a single crystal piece with a continuously increasing diameter, f) pulling a cylindrical single crystal piece with a diameter $D_6$ where $D_6 > D_5$, and g) raising the supporting apparatus, so that the bearing portion touches and supports the thickened neck from below.

9. The process of claim 8, wherein the supporting apparatus, in step d), is lifted only by a distance such that it still does not touch the thickened neck.

10. The process of claim 8, wherein the supporting apparatus is lifted continuously during step e), so that the supporting apparatus continues not to touch the thickened neck.

11. The process of claim 9, wherein the supporting apparatus is lifted continuously during step e), so that the supporting apparatus continues not to touch the thickened neck.

12. The process of claim 8, wherein step g) takes place as soon as the supporting apparatus has been cooled to such an extent that it can support the load of the crystal.

13. The process of claim 9, wherein step g) takes place as soon as the supporting apparatus has been cooled to such an extent that it can support the load of the crystal.

14. The process of claim 12, wherein step g) takes place during step f).

15. The process of claim 12, wherein the supporting apparatus, during step f) and after step g) has been carried out, is subjected to increasingly higher loading.

* * * * *